United States Patent
Lin et al.

(10) Patent No.: US 10,686,000 B1
(45) Date of Patent: Jun. 16, 2020

(54) SOLID-STATE IMAGING DEVICE

(71) Applicant: VisEra Technologies Company Limited, Hsin-Chu (TW)

(72) Inventors: Cheng-Hsuan Lin, Taipei (TW); Zong-Ru Tu, Zhubei (TW); Yu-Chi Chang, Hukou Township, Hsinchu County (TW); Ching-Hua Li, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/382,808

(22) Filed: Apr. 12, 2019

(51) Int. Cl.
 *H01L 27/146* (2006.01)
 *H04N 9/04* (2006.01)
 *H04N 5/369* (2011.01)

(52) U.S. Cl.
 CPC .. *H01L 27/14625* (2013.01); *H01L 27/14621* (2013.01); *H01L 27/14645* (2013.01); *H01L 27/14685* (2013.01); *H04N 5/36961* (2018.08); *H04N 9/0455* (2018.08)

(58) Field of Classification Search
 CPC ......... H01L 27/14627; H01L 27/14629; H01L 27/1464; H01L 27/14685; H01L 27/14636; H01L 27/14621; H01L 27/14645; H01L 27/14632; H01L 27/14625; H04N 9/0455; H04N 5/36961
 See application file for complete search history.

(56) References Cited

U.S. PATENT DOCUMENTS

| 9,559,226 | B2 | 1/2017 | Akiyama | |
| 2010/0230578 | A1* | 9/2010 | Horikoshi | H01L 27/14625 250/208.1 |
| 2013/0134536 | A1* | 5/2013 | Mori | H01L 27/1462 257/432 |
| 2015/0028405 | A1* | 1/2015 | Minami | H01L 27/14629 257/294 |

FOREIGN PATENT DOCUMENTS

| CN | 102893400 A | 1/2013 |
| TW | 200939463 A | 9/2009 |
| TW | I525151 B | 3/2016 |

OTHER PUBLICATIONS

Office Action dated Feb. 12, 2020 in TW Application No. 108118031.

* cited by examiner

*Primary Examiner* — Selim U Ahmed
(74) *Attorney, Agent, or Firm* — Muncy, Geissler, Olds & Lowe, P.C.

(57) ABSTRACT

A solid-state imaging device includes multiple photoelectric conversion elements arrayed in a pixel array. The solid-state imaging device also includes a color filter layer having multiple color filter segments above the photoelectric conversion elements. Each of the color filter segments is disposed in a respective pixel of the pixel array. The solid-state imaging device further includes an optical waveguide layer over the color filter layer. The optical waveguide layer includes a waveguide partition grid and a waveguide material in the spaces of the waveguide partition grid. The waveguide material has a refractive index that is higher than the refractive index of the waveguide partition grid. The waveguide material provides the same refractive index for each pixel of the pixel array.

20 Claims, 10 Drawing Sheets

SOLID-STATE IMAGING DEVICE

BACKGROUND

Field of the Invention

The invention relates to imaging devices, and more particularly to solid-state imaging devices with a top optical waveguide layer above a color filter layer.

Description of the Related Art

Image sensors, such as charge-coupled device (CCD) image sensors and complementary metal-oxide semiconductor (CMOS) image sensors, have been widely used in various image-capturing apparatuses such as digital still-image cameras, digital video cameras, and the like. An image sensor has multiple pixels arranged in a pixel array. Each pixel has a photoelectric transducer such as a photodiode formed in a semiconductor substrate such as a silicon chip. The photodiodes generate electric charges by performing photoelectric conversion of light incident on the image sensor. The electric charges corresponding to photoelectrons generated in the photodiodes are transmitted and amplified by a CCD-type or a CMOS-type reading circuit to obtain imaging signals.

Some image capture devices use phase difference detection sensors to perform autofocus. On-sensor phase difference detection works by interspersing phase-detection autofocus (PDAF) pixels between imaging pixels, typically arranged in repeating sparse patterns of left and right pixels. The image sensor detects phase differences between signals generated by different phase difference detection pixels, for example between a left pixel and a nearby right pixel. In general, phase detection autofocus operates faster than contrast-based autofocus.

Recently, the trend has been for the pixel size of image sensors typified by CMOS image sensors to be reduced for the purpose of increasing the number of pixels to provide high-resolution images. However, while pixel size continues to decrease, there are still various challenges in the design and manufacturing of image sensors.

BRIEF SUMMARY

In traditional CMOS image sensors (CIS), it is easy to have cross-talk issue at the corners of the image sensor since incident light radiates onto the edges of the pixel array of the image sensor at an oblique angle. The cross-talk issue may cause image detection failure and auto-focus function error without a good algorithms. As pixel size continues to decrease, the cross-talk issue worsens.

According to embodiments of the disclosure, a top-guide structure is disposed on a color filter layer to overcome the cross-talk issue of solid-state imaging devices. The top-guide structure is an optical waveguide layer that includes a low refractive index partition grid and a high refractive index material in the spaces of the low refractive index partition grid. In addition, the top-guide structure of the embodiments of the disclosure can enhance phase-detection auto-focus (PDAF) function of the solid-state imaging devices.

In some embodiments, a solid-state imaging device is provided. The solid-state imaging device includes a plurality of photoelectric conversion elements arrayed in a pixel array. The solid-state imaging device also includes a color filter layer having a plurality of color filter segments above the photoelectric conversion elements. Each of the color filter segments is disposed in a respective pixel of the pixel array. The solid-state imaging device further includes an optical waveguide layer over the color filter layer. The optical waveguide layer includes a waveguide partition grid and a waveguide material in the spaces of the waveguide partition grid. The waveguide material has a refractive index that is higher than the refractive index of the waveguide partition grid. The waveguide material provides the same refractive index for each pixel of the pixel array.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

The following description is of the contemplated mode of carrying out the disclosure. This description is made for the purpose of illustrating the general principles of the disclosure and should not be taken in a limiting sense. The scope of the disclosure is best determined by reference to the appended claims.

In solid-state imaging devices, an incident light radiates onto the edges of a pixel array at an oblique angle that is greater than a normal angle of the incident light radiating onto the center area of the pixel array. The angles of the incident light are determined from the normal line of a light-receiving surface of the solid-state imaging devices. For example, an oblique angle of an incident light radiating onto the edges of the pixel array is about +/−20 degrees to about +/−40 degrees, and the normal angle of the incident light radiating onto the center area of the pixel array is about 0 degrees.

Solid-state imaging devices are roughly classified into two groups in terms of the direction of light incident on a light receiving unit. One is the front-side illuminated (FSI) imaging devices that receive light incident on the front side of a semiconductor substrate on which the wiring layer of the reading circuit is formed. The other is the back-side illuminated (BSI) imaging devices that receive light incident on the back side of a semiconductor substrate on which no wiring layer is formed. For imaging a color image, a color filter is provided in the FSI and BSI imaging devices. The FSI and BSI imaging devices usually have a light-shielding grid structure for blocking light between pixels to prevent color mixture.

Figure 1:
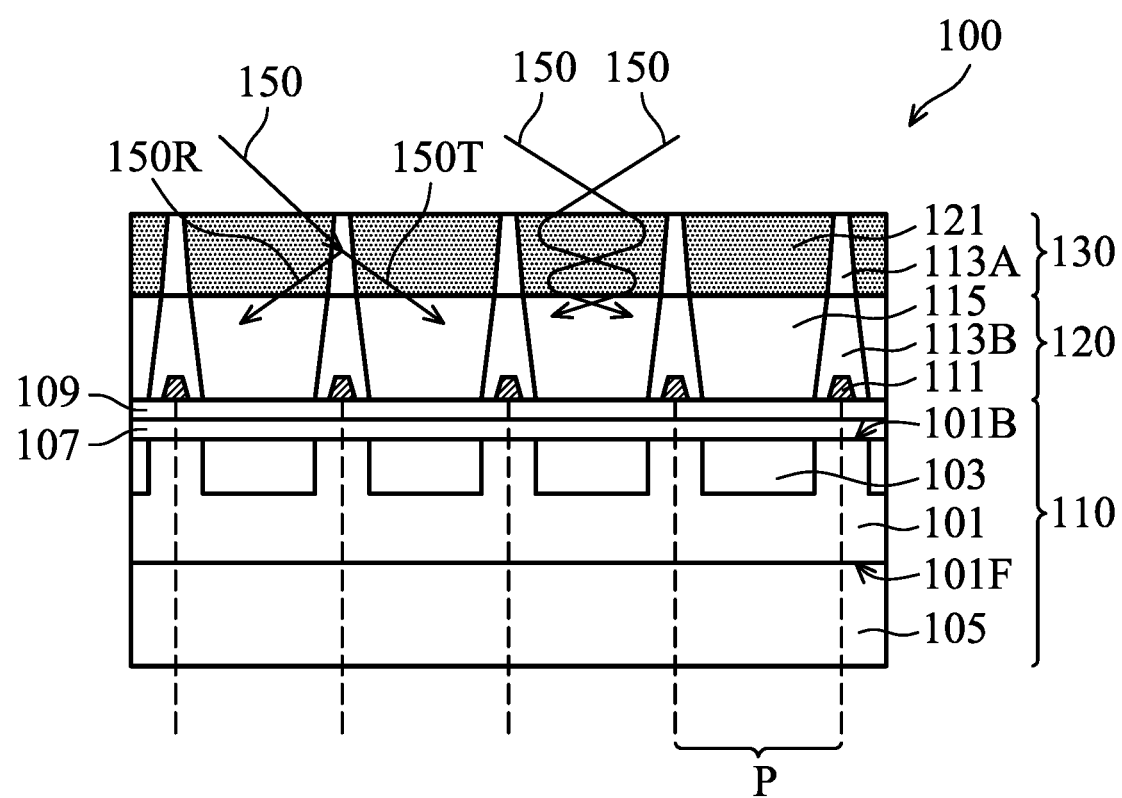
FIG. 1 shows a schematic cross section of a solid-state imaging device according to some embodiments of the disclosure.

FIG. 1 shows a cross section of a solid-state imaging device 100 according to some embodiments of the disclosure. The solid-state imaging device 100 can be formed of a complementary metal-oxide semiconductor (CMOS) image sensor or a charge coupled device (CCD) image sensor. The solid-state imaging device 100 includes a semiconductor substrate 101 for example a wafer or a chip. The semiconductor substrate 101 has a front surface 101F and a back surface 101B opposite to the front surface 101F. Multiple photoelectric conversion elements 103 such as photodiodes are formed in the semiconductor substrate 101. The photoelectric conversion elements 103 may be referred to as photodiodes 103 thereafter. The solid-state imaging device 100 has multiple pixels P that are arranged in a pixel array. Each of the photodiodes 103 is disposed in one respective pixel of the pixel array. The photodiodes 103 in the semiconductor substrate 101 are isolated from each other by isolation structures (not shown) such as shallow trench isolation (STI) regions or deep trench isolation regions. The isolation structures are formed in the semiconductor substrate 101 using etching process to form trenches and filling the trenches with an insulating or dielectric material. Although figures of the solid-state imaging devices of the embodiments show several pixels, actually the solid-state imaging devices have several million or more pixels in the pixel array.

In some embodiments, the photodiodes 103 are formed on the back surface 101B of the semiconductor substrate 101. A wiring layer 105 is formed on the front surface 101F of the semiconductor substrate 101. The wiring layer 105 is an interconnect structure that includes multiple conductive lines and vias embedded in multiple dielectric layers, and may further include various electric circuits required for the solid-state imaging device 100. Incident lights 150 radiate onto the side of the back surface 101B and are received by the photodiodes 103. The solid-state imaging device 100 as shown in FIG. 1 is referred to as a back-side illuminated (BSI) imaging device. In some other embodiments, the solid-state imaging device may be a front-side illuminated (FSI) imaging device. The semiconductor substrate 101 and the wiring layer 105 as shown in FIG. 1 are inverted for FSI imaging device. In the FSI imaging device, incident lights 150 radiate onto the side of the front surface 101F, pass through the wiring layer 105 and then are received by the photodiodes 103 formed on the back surface 101B of the semiconductor substrate 101. The path of incident light passing through an FSI imaging device to reach the photodiodes is farther than that of a BSI imaging device.

As shown in FIG. 1, in some embodiments, the solid-state imaging device 100 further includes a high dielectric-constant (high-k) film 107 formed on the back surface 101B of the semiconductor substrate 101 and covering the photoelectric conversion elements 103. The high-k film 107 may be formed of hafnium oxide ($HfO_2$), hafnium tantalum oxide (HfTaO), hafnium titanium oxide (HMO), hafnium zirconium oxide (HfZrO), tantalum pentoxide ($Ta_2O_5$) or other suitable high-k dielectric materials using a deposition process. The deposition process is for example chemical vapor deposition (CVD), plasma enhanced CVD (PECVD), atomic layer deposition (ALD), or another deposition technique. The high-k film 107 has a high-refractive index and a light-absorbing ability.

In some embodiments, the solid-state imaging device 100 also includes a buffer layer 109 formed on the high-k film 107. The buffer layer 109 may be formed of silicon oxides, silicon nitrides, silicon oxynitrides, or other suitable insulating materials using a deposition process. The deposition process is for example spin-on coating, CVD, flowable CVD (FCVD), PECVD, physical vapor deposition (PVD), or another deposition technique. The semiconductor substrate 101, the photoelectric conversion elements (or photodiodes) 103, the wiring layer 105, the high-k film 107 and the buffer layer 109 may be together referred to as a photoelectric conversion structure 110.

In addition, the solid-state imaging device 100 includes a light-shielding layer 111 formed on the buffer layer 109, as shown in FIG. 1 in accordance with some embodiments. The light-shielding layer 111 includes multiple light-shielding partitions disposed between the pixels of the solid-state imaging device 100. From a top view, the light-shielding partitions of the light-shielding layer 111 constitute a grid structure. In some examples, the light-shielding layer 111 is made of metal and may be referred to as a metal grid structure.

A color filter partition grid 113B is formed on and covers the light-shielding partitions of the light-shielding layer 111. The color filter partition grid 113B is made of a transparent dielectric material that has a low refractive index in a range from about 1.0 to about 1.99. Multiple color filter segments 115 are disposed in the spaces of the color filter partition grid 113B, respectively. The refractive index of the color filter partition grid 113B is lower than the refractive indexes of the color filter segments 115. Each color filter segment 115 corresponds to one respective photoelectric conversion element 103 in the pixel P. In some embodiments, the color filter segments 115 include red (R), green (G) and blue (B) color filter segments arrayed by a suitable arrangement. The four color filter segments 115 shown in FIG. 1 are for example arrayed by G, G, R and R in sequence. In some other embodiments, the color filter segments 115 may further include white (W) or another color filter segment arrayed with R, G and B color filter segments together in a suitable arrangement. The color filter segments 115 may have a top surface that is level with the top surface of the color filter partition grid 113B. The light-shielding layer 111, the color filter partition grid 113B and the color filter segments 115 may be together referred to as a color filter layer 120.

According embodiments of the disclosure, a top-guide structure such as an optical waveguide layer 130 is formed on the color filter layer 120. The optical waveguide layer 130 includes a waveguide partition grid 113A on the color filter partition grid 113B and a waveguide material 121 in the spaces of the waveguide partition grid 113A. The top surface of the waveguide material 121 is level with the top surface of the waveguide partition grid 113A. In some embodiments, the waveguide partition grid 113A is made of a transparent dielectric material that has a low refractive index in a range from about 1.0 to about 1.99. The waveguide material 121 is made of another transparent dielectric material having a refractive index that is higher than the refractive index of the waveguide partition grid 113A. In some embodiments, the refractive index of the waveguide material 121 is in a range from about 1.1 to about 2.0.

Generally, waves propagate in all directions in open space as spherical waves. The power of the wave falls with the distance R from the source as the square of the distance (inverse square law). For example, while optical wave, i.e. light propagates in a microlens structure of an image sensor, the energy of the light falls with the distance R from the light source as the square of the distance. However, a waveguide structure can confine the wave to propagate in one dimension, so that, under ideal conditions, the wave loses no power while propagating. Due to total reflection at the walls of the waveguide structure, waves are confined to the interior of the waveguide structure.

An optical waveguide is a structure that guides electromagnetic waves in the optical spectrum such as visible light, with minimal loss of energy by restricting expansion to one dimension or two dimensions. The top-guide structure in some embodiments of the disclosure is an optical waveguide layer formed above a color filter layer of solid-state imaging devices. Without the physical constraint of an optical waveguide layer, wave amplitudes decrease according to the inverse square law as they expand into a three dimensional space.

Waveguides used at optical frequencies are typically dielectric waveguides structures in which a dielectric material with high permittivity, i.e. high refractive index, is surrounded by a material with lower permittivity, i.e. low refractive index. The structure guides optical waves by total internal reflection. An example of an optical waveguide is optical fiber.

In the embodiments of the disclosure, the waveguide material 121 with a higher refractive index than that of the waveguide partition grid 113A can guide oblique incident lights 150 radiating onto the solid-state imaging device 100 by total internal reflection as shown in FIG. 1. Therefore, the optical waveguide layer 130 of the embodiments of the disclosure can confine the oblique incident lights 150 to propagate in one dimension towards the color filter segments 115. Due to total reflection at the walls of the waveguide partition grid 113A, lights are confined to the interior of the waveguide material 121 of the optical waveguide layer 130, so that the incident lights 150 may lose no or slight power while propagating to the color filter segments 115. The sensitivity of the pixels of the solid-state imaging devices is thereby enhanced.

In addition, according to embodiments of the disclosure, the portions of the waveguide material 121 at different pixels with the same color or different colors of the color filter segments 115 are made of the same material. Therefore, the optical waveguide layer 130 can provide equivalent refractive index at different pixels with the same color or different colors. As shown in FIG. 1, the oblique incident light 150 radiating into the waveguide partition grid 113A is divided into a reflected light 150R by reflection and a transmitted light 150T by transmission. The reflected light 150R and the transmitted light 150T pass through the waveguide material 121 of the same material at different pixels, such that the reflected light 150R and the transmitted light 150T have the same energy to enter into the color filter segments 115 at different pixels. Therefore, the optical waveguide layer 130 can make the reflected light 150R and the transmitted light 150T much more consistent at the neighboring pixels. The cross talk issue at the corners of the solid-state imaging device is thereby overcome according to the embodiments of the disclosure.

While solid-state imaging devices without the optical waveguide layer of the embodiments of the disclosure above the color filter layer, an oblique incident light directly radiates into the color filter partition grid and is divided into a reflected light and a transmitted light. The reflected light and the transmitted light entering into the color filter segments with different colors at neighboring pixels will cause the reflected light and the transmitted light to have different energies. The different energies in the reflected light and the transmitted light cause different signal strengths at neighboring pixels with the same color, which is referred to as channel separation. The channel separation will cause image detection effect worse.

As a result of measurement of sensitivities at different pixels of the same color, in the solid-state imaging device with the optical waveguide layer of the embodiments of the disclosure, the sensitivity difference at G pixels is about 2.7% (normalize sensitivity), the sensitivity difference at R pixels is about 1.4%, and the sensitivity difference at B pixels is about 1.6%. However, in solid-state imaging device without the optical waveguide layer of the embodiments of the disclosure, the sensitivity difference at G pixels is about 4.9% (normalize sensitivity), the sensitivity difference at R pixels is about 1.5%, and the sensitivity difference at B pixels is about 4.4%. The above mentioned result proves that the solid-state imaging devices with the optical waveguide layer of the embodiments of the disclosure can make the sensitivities more consistent at different pixels of the same color. Therefore, according to the optical waveguide layer of the embodiments of the disclosure, the issue of channel separation can be overcome and the image detection effect of the solid-state imaging devices is improved.

In some embodiments, the waveguide partition grid 113A and the color filter partition grid 113B are made of the same material. In addition, the waveguide partition grid 113A and the color filter partition grid 113B can be fabricated together by the same process step such as deposition and etching processes. In some other embodiments, the waveguide partition grid 113A and the color filter partition grid 113B are made of different materials and are fabricated separately by different process steps.

Figure 2A:
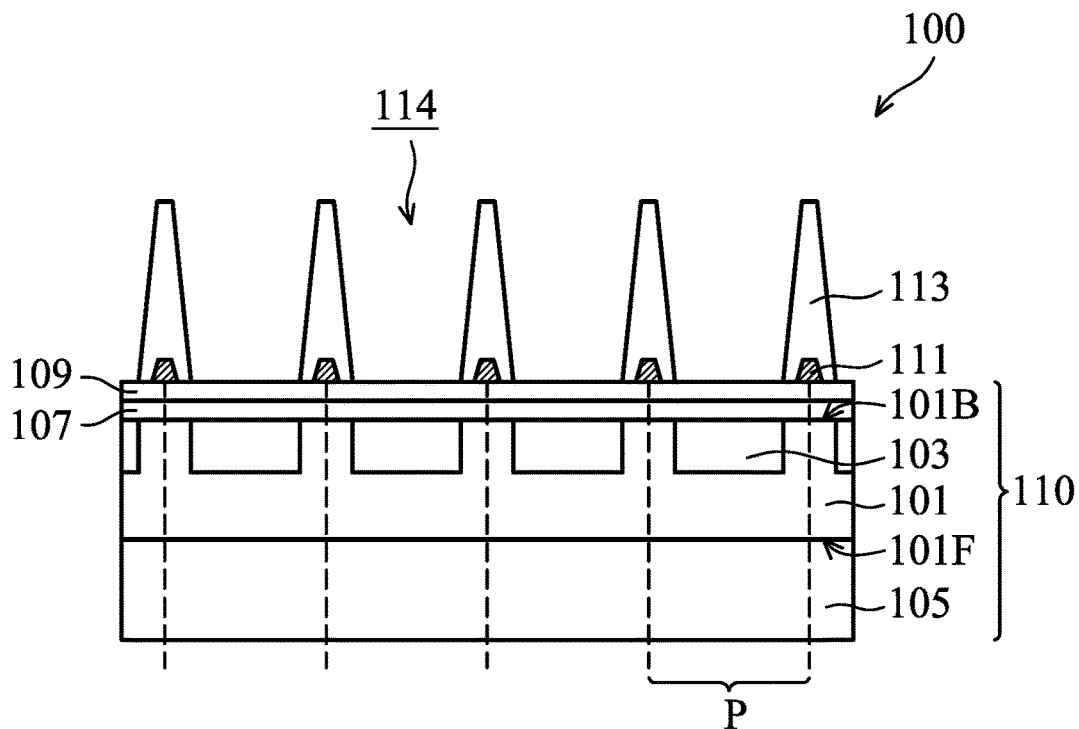
FIGS. 2A-2C show schematic cross sections of structures at various stages of an exemplary method of forming a solid-state imaging device with an optical waveguide layer of FIG. 1 according to some embodiments of the disclosure.
Figure 2B:
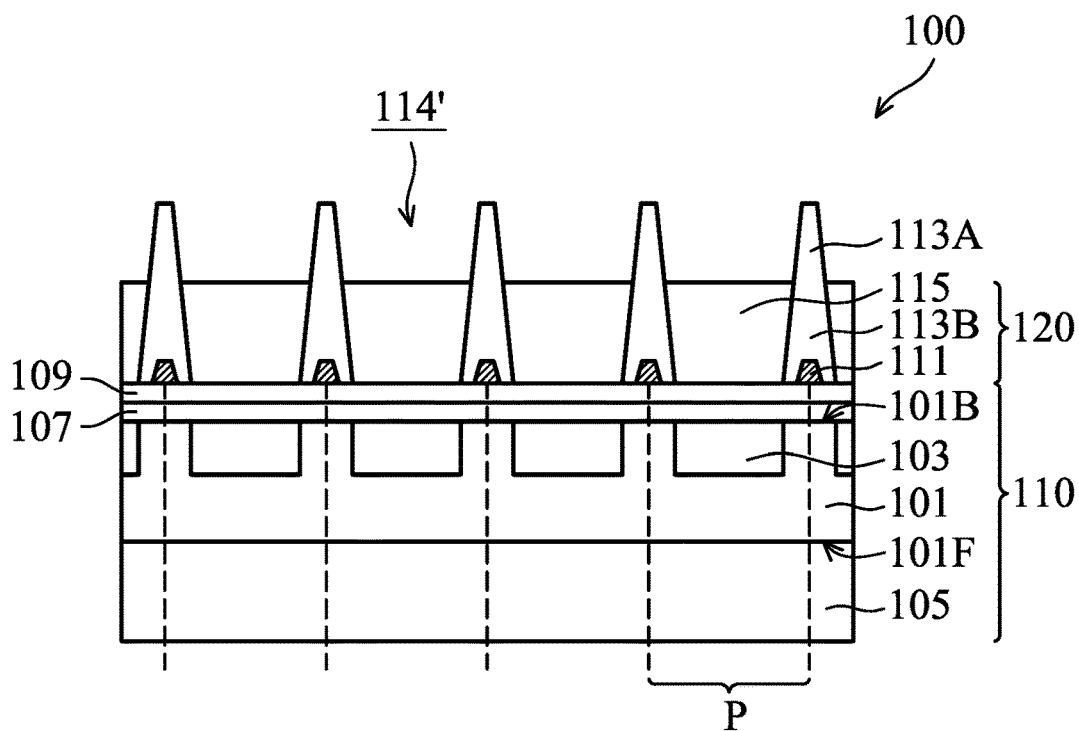
Figure 2C:
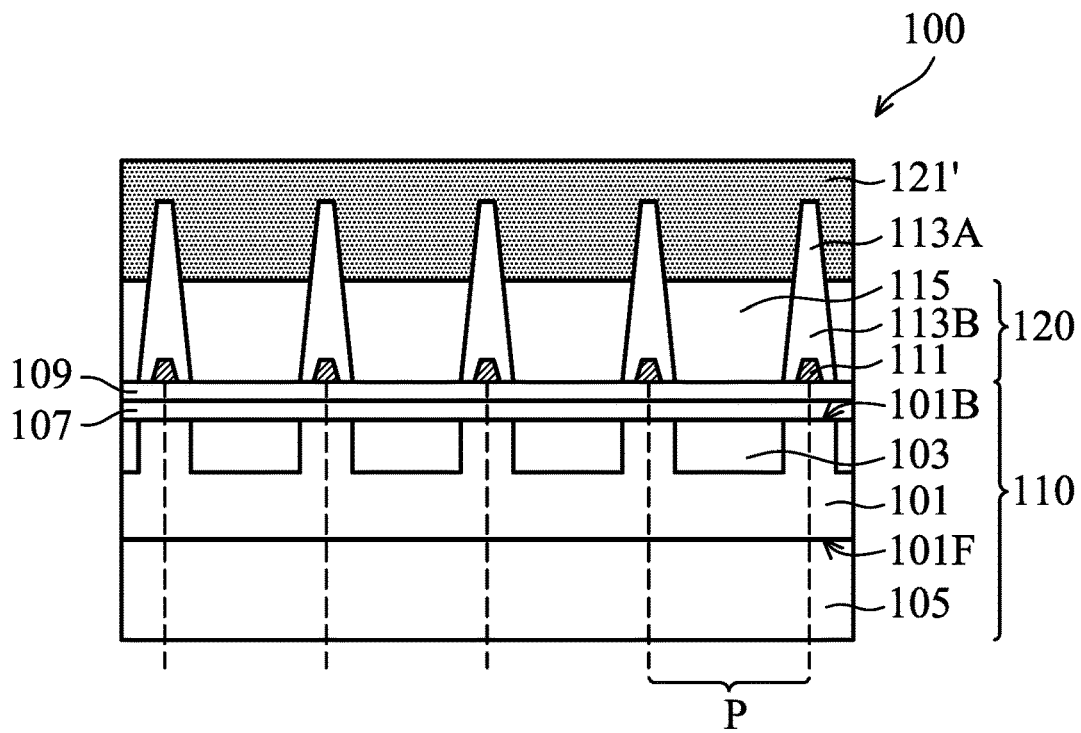

FIGS. 2A-2C show cross sections of structures at various stages of an exemplary method of forming the solid-state imaging device 100 with the optical waveguide layer 130 of FIG. 1 according to some embodiments of the disclosure. As shown in FIG. 2A, firstly, the light-shielding layer 111 is formed on the buffer layer 109 of the photoelectric conversion structure 110. The light-shielding layer 111 may be formed by depositing a metal layer on the buffer layer 109 and then patterning the metal layer using photolithography and etching processes to form a grid structure consisting of multiple light-shielding partitions. Next, a partition grid 113 is formed on the buffer layer 109 and covers the light-shielding layer 111. The partition grid 113 is formed by depositing a transparent dielectric material layer and then patterning the transparent dielectric material layer using photolithography and etching processes to form multiple partitions of the partition grid 113. In some examples, the transparent dielectric material layer has a refractive index of about 1.0 to about 1.99. There are multiple spaces 114 between the partitions of the partition grid 113. Each space 114 corresponds to one respective pixel.

Afterwards, the spaces 114 of the partition grid 113 are filled with the color filter segments 115 as shown in FIG. 2B. The lower portion of the partition grid 113 surrounding the color filter segments 115 is referred to as the color filter partition grid 113B. The upper portion of the partition grid 113 without surrounding the color filter segments 115 is used as the waveguide partition grid 113A. There are multiple spaces 114' between the partitions of the waveguide partition grid 113A.

Next, referring to FIG. 2C, the spaces 114' of the waveguide partition grid 113A are filled with a transparent dielectric material 121' using a depositing or coating process. In some examples, the transparent dielectric material 121' has a refractive index of about 1.1 to about 2.0 in some embodiments. The refractive index of the transparent dielectric material 121' is higher than the refractive index of the partition grid 113 (FIG. 2A). In some instances, the transparent dielectric material 121' covers the top surface of the waveguide partition grid 113A after the depositing or coating process as shown in FIG. 2C. The excess portions of the transparent dielectric material 121' may be removed by a planarization process such as a chemical mechanical polishing (CMP) process to form the waveguide material 121 as shown in FIG. 1. After the planarization process, the top surface of the waveguide material 121 is level with the top surface of the waveguide partition grid 113A.

Figure 3:
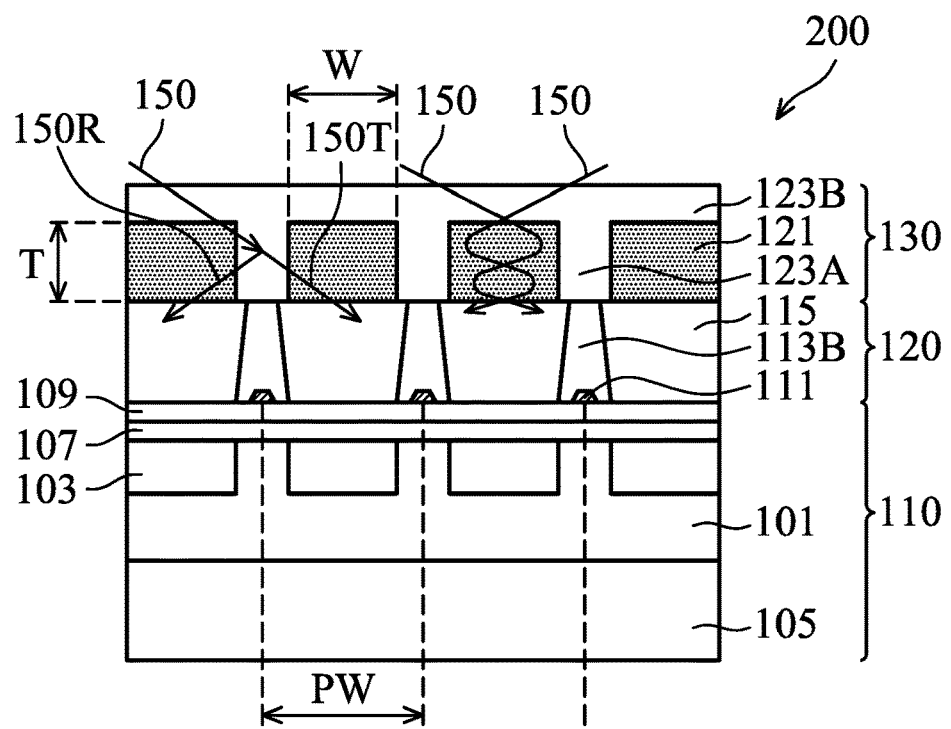
FIG. 3 shows a schematic cross section of a solid-state imaging device according to some embodiments of the disclosure.

FIG. 3 shows a cross section of a solid-state imaging device 200 according to some embodiments of the disclosure. The solid-state imaging device 200 has an optical waveguide layer 130 above the color filter layer 120. The color filter layer 120 also includes the light-shielding layer 111, the color filter partition grid 113B on and covering the light-shielding layer 111, and the color filter segments 115 in the spaces of the color filter partition grid 113B. The color filter segments 115 and the color filter partition grid 113B have a coplanar top surface.

The optical waveguide layer 130 includes the waveguide material 121, a waveguide partition grid 123A and an anti-reflection film 123B. From a top view, the waveguide material 121 is in the spaces of the waveguide partition grid 123A. The waveguide material 121 and the waveguide partition grid 123A have a coplanar top surface, and the anti-reflection film 123B is on the coplanar top surface. In some embodiments, the waveguide partition grid 123A and the anti-reflection film 123B are made of the same material and are formed together in the same process step. In addition, the waveguide partition grid 123A and the color filter partition grid 113B are fabricated separately by different process steps. The waveguide partition grid 123A is in direct contact with the color filter partition grid 113B. The waveguide material 121 has a refractive index that is higher than the refractive index of the waveguide partition grid 123A and the anti-reflection film 123B. In some examples, the waveguide material 121 has a thickness T that is in a range from about 0.2 μm to about 1.5 μm. Furthermore, the thickness T may be in a range from about 0.2 μm to about 0.7 μm. The waveguide material 121 at one respective pixel has a width W, and the pixel has a pixel size PW in width. In some examples, the ratio of the width W of the waveguide material 121 to the pixel size PW of the pixel is in a range from about 0.15 to about 0.95.

According to the embodiments of the disclosure, the optical waveguide layer 130 of FIG. 3 can guide oblique incident lights 150 radiating onto the solid-state imaging device 200 by total internal reflection in the waveguide material 121 as shown in FIG. 3. Therefore, the optical waveguide layer 130 can confine the oblique incident lights 150 to propagate in one dimension towards the color filter segments 115. Due to total reflection at the walls of the waveguide partition grid 123A, lights are confined to the interior of the waveguide material 121 of the optical waveguide layer 130, and the incident lights 150 lose no or slight power while propagating to the color filter segments 115.

Moreover, in the embodiment of FIG. 3, the portions of the waveguide material 121 at different pixels with the same color or different colors are made of the same material. Therefore, the optical waveguide layer 130 can provide equivalent refractive index at different pixels with the same color or different colors. As shown in FIG. 3, the oblique incident light 150 radiating into the waveguide partition grid 123A is divided into a reflected light 150R and a transmitted light 150T. The reflected light 150R and the transmitted light 150T pass through the waveguide material 121 of the same material at different pixels, such that the reflected light 150R and the transmitted light 150T have the same energy to enter into the color filter segments 115 at different pixels. Accordingly, the optical waveguide layer 130 can make the reflected light 150R and the transmitted light 150T much more consistent at different pixels. The cross talk issue at the corners of the solid-state imaging devices is thereby overcome. Moreover, the optical waveguide layer 130 can avoid the above mentioned channel separation. The image detection effect of the solid-state imaging devices of the embodiments of the disclosure is thereby improved.

Figure 4A:
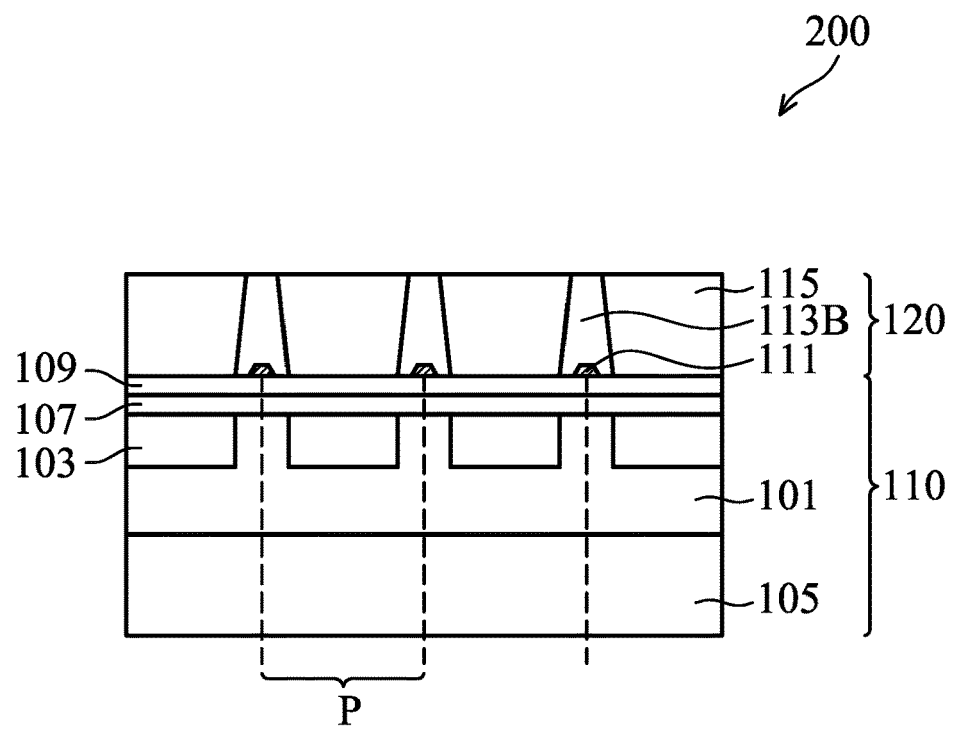
FIGS. 4A-4C show schematic cross sections of structures at various stages of an exemplary method of forming a solid-state imaging device with an optical waveguide layer of FIG. 3 according to some embodiments of the disclosure.
Figure 4B:
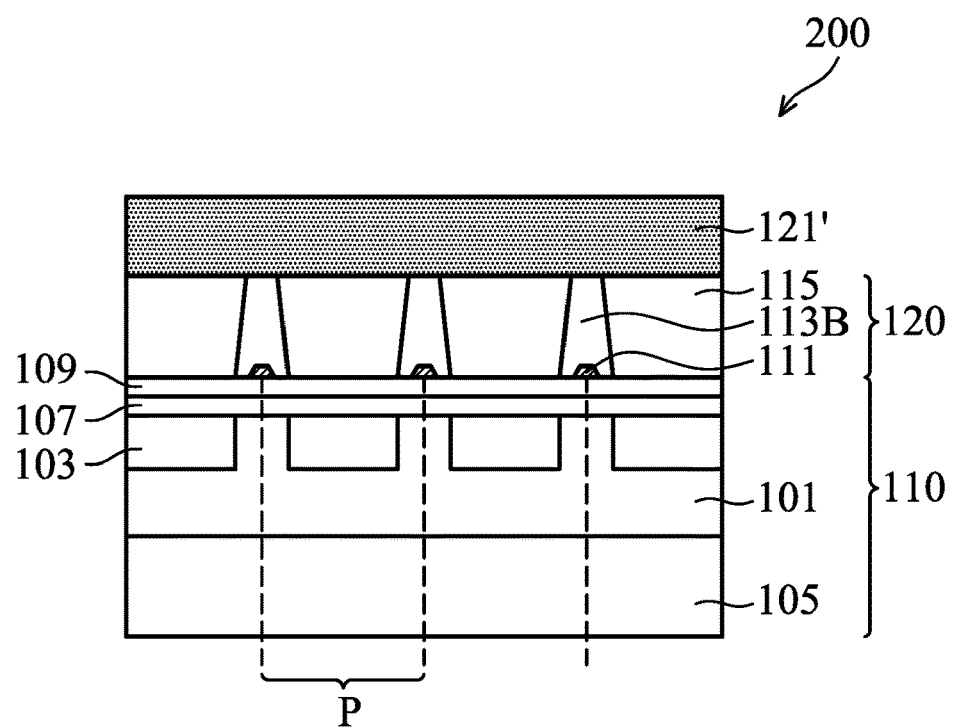
Figure 4C:
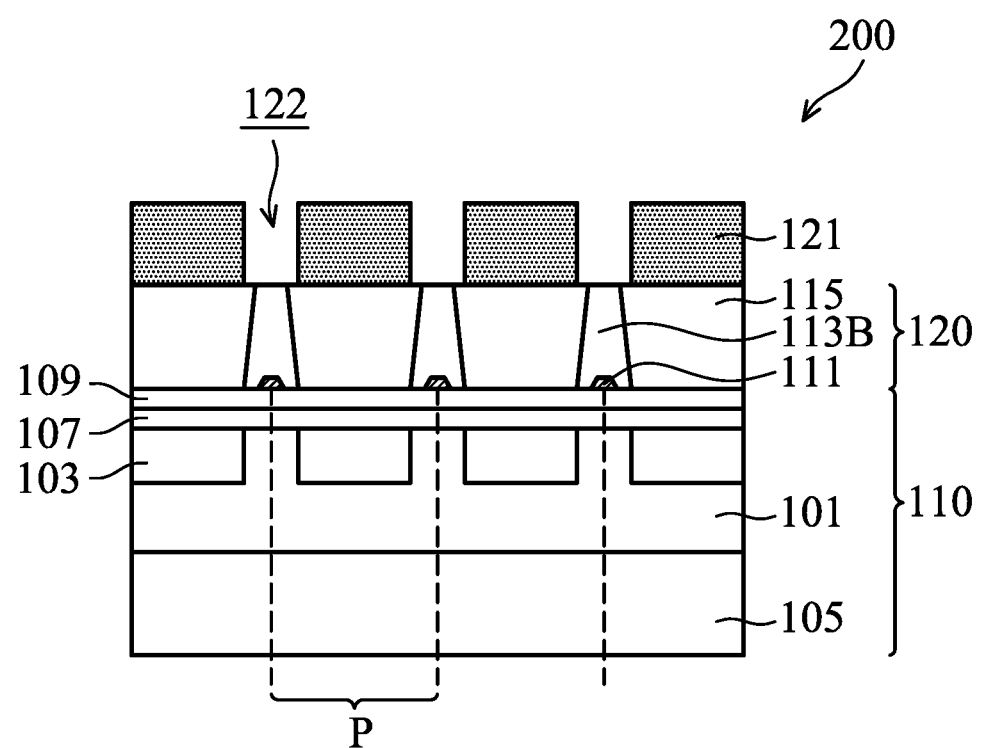

FIGS. 4A-4C show cross sections of structures at various stages of an exemplary method of forming the solid-state imaging device 200 with the optical waveguide layer 130 of FIG. 3 according to some embodiments of the disclosure. As shown in FIG. 4A, firstly, the light-shielding layer 111 is formed on the buffer layer 109 of the photoelectric conversion structure 110. Next, the color filter partition grid 113B is formed on the buffer layer 109 and covers the light-shielding layer 111. The materials and processes for forming the light-shielding layer 111 and the color filter partition grid 113B may be the same as or similar to those described above with respect to FIG. 2A. Afterwards, the spaces of the color filter partition grid 113B are filled with the color filter segments 115 using a depositing or coating process. A planarization process for example a CMP process may be performed on the deposited or coated materials of the color filter segments 115. Thereafter, the color filter segments 115 and the color filter partition grid 113B have a coplanar top surface to form the color filter layer 120 as shown in FIG. 4A.

Next, a transparent dielectric material 121' is deposited on the color filter layer 120 as shown in FIG. 4B. In some examples, the transparent dielectric material 121' has a refractive index of about 1.1 to about 2.0. Afterwards, referring to FIG. 4C, the transparent dielectric material 121' is patterned to form multiple openings 122. The positions of the openings 122 may be aligned with the color filter partition grid 113B. The transparent dielectric material 121' may be patterned using photolithography and etching processes. The remaining portions of the transparent dielectric material 121' between the openings 122 are used as the waveguide material 121 of the optical waveguide layer 130 shown in FIG. 3. Thereafter, a transparent dielectric material is deposited or coated on the waveguide material 121 and to fill the openings 122. The portions of the transparent dielectric material in the openings 122 form the waveguide partition grid 123A of the optical waveguide layer 130 shown in FIG. 3. The portions of the transparent dielectric material on the waveguide material 121 and the waveguide partition grid 123A form the anti-reflection film 123B of the optical waveguide layer 130 shown in FIG. 3. The transparent dielectric material of the anti-reflection film 123B and the waveguide partition grid 123A has a refractive index that is lower than the refractive index of the waveguide material 121.

Figure 5A:
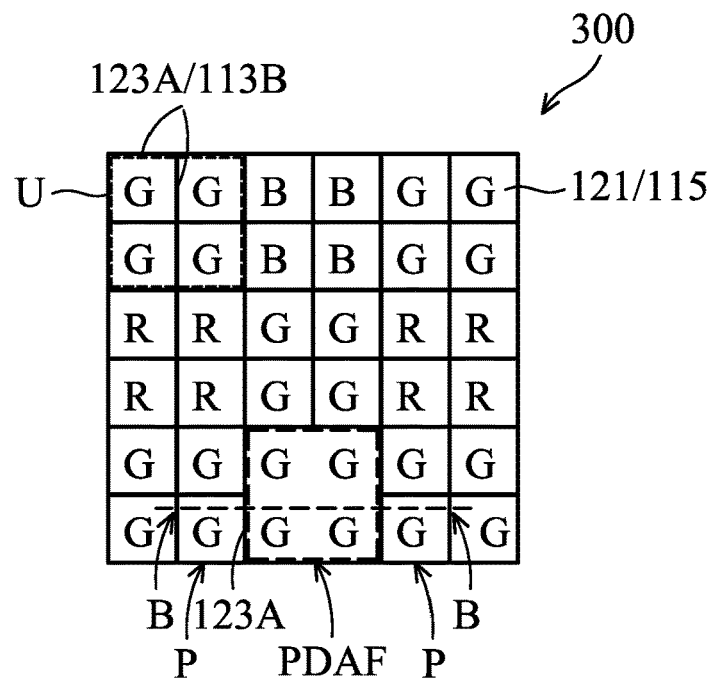
FIG. 5A shows a schematic plane view of a part of a pixel array of a solid-state imaging device with phase-detection auto-focus (PDAF) pixels according to some embodiments of the disclosure.

FIG. 5A shows a plane view of a part of a pixel array in a solid-state imaging device 300 having phase-detection auto-focus (PDAF) pixels according to some embodiments of the disclosure. In the solid-state imaging device 300, each pixel of the pixel array has one respective color filter segment 115. In some instances, a color filter unit U consists of four color filter segments 115 with the same color. Multiple color filter units U of different colors, for example R, G and B, are arrayed by a suitable arrangement. In the normal pixels P of the solid-state imaging device 300 for imaging function, the color filter segments 115 are separated from each other by the color filter partition grid 113B. In the PDAF pixels of the solid-state imaging device 300 for PDAF function, for example the four color filter segments 115 with the same color of G are in contact with each other and surrounded by the color filter partition grid 113B to separate from the color filter segments 115 at the neighboring normal pixels. In addition, the waveguide material 121 disposed on the color filter segments 115 at the normal pixels can be separated by the waveguide partition grid 123A. The waveguide partition grid 123A is disposed above and may be aligned with the color filter partition grid 113B. In addition, the waveguide material 121 disposed on the color filter segments 115 at the PDAF pixels are connected together and surrounded by the waveguide partition grid 123A to separate from the waveguide material 121 at the neighboring normal pixels. The PDAF pixels are arrayed with the normal pixels at any suitable position that may be random or regular.

Figure 5B:
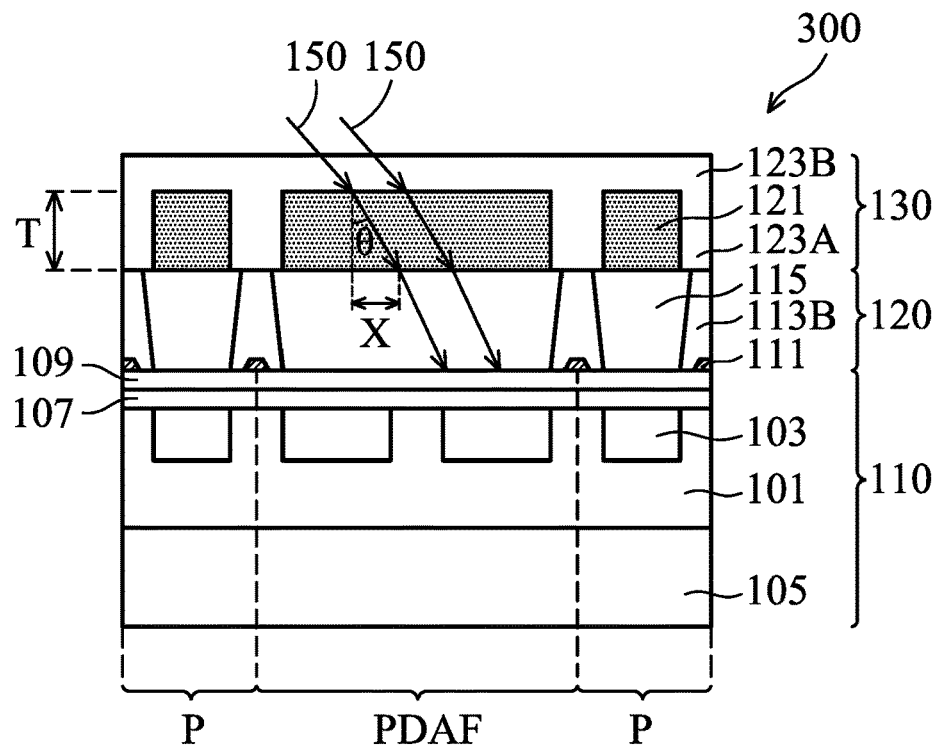
FIG. 5B shows a schematic cross section of a solid-state imaging device with PDAF pixels, along line B-B of FIG. 5A, according to some embodiments of the disclosure.

FIG. 5B shows a cross section of the solid-state imaging device 300 having the PDAF pixels, along line B-B of FIG. 5A, according to some embodiments of the disclosure. The structure of the solid-state imaging device 300 is similar to that of the solid-state imaging device 200 in FIG. 3, except for the PDAF pixels. The PDAF pixels consist of multiple pixels, for example the PDAF pixels consist of four pixels as shown in FIG. 5A. In the PDAF pixels, there are multiple photoelectric conversion elements 103 used for PDAF function. According to the embodiments of the disclosure, the oblique incident lights 150 entering the PDAF pixels are refracted by the waveguide material 121 of the optical waveguide layer 130 at an angle θ with a distance X of the light traveling in the waveguide material 121. The waveguide material 121 has a thickness T, and the distance X is equal to T*tan θ.

The optical waveguide layer 130 of the embodiments of the disclosure can enhance PDAF function of the solid-state imaging devices. As a result of measurement of sensitivities at different pixels of the PDAF pixels in the solid-state imaging device with the optical waveguide layer of the embodiments, the ratio of the sensitivities at two green pixels of the PDAF pixels in different positions is about 2.8. However, in solid-state imaging device without the optical waveguide layer of the embodiments, the ratio of the sensitivities at two green pixels of PDAF pixels in different positions is about 1.9. Accordingly, using the optical waveguide layer of the embodiments of the disclosure can increase the phase difference of the PDAF pixels, and the PDAF function of the solid-state imaging devices is thereby enhanced.

In solid-state imaging devices, an incident light radiates onto the edges of a pixel array at an oblique angle that is greater than a normal angle of the incident light radiating onto the center area of the pixel array. The oblique incident light radiating at the edges of the pixel array or at the peripheral area outside of the central area of the solid-state imaging devices may cause the sensitivity at those pixels decrease. According to embodiments of the disclosure, shifting the position of the waveguide partition grid for the normal pixels, the PDAF pixels or a combination thereof is provided to enhance the sensitivity at the edges of the pixel array or at the peripheral area of the solid-state imaging devices.

Figure 6A:
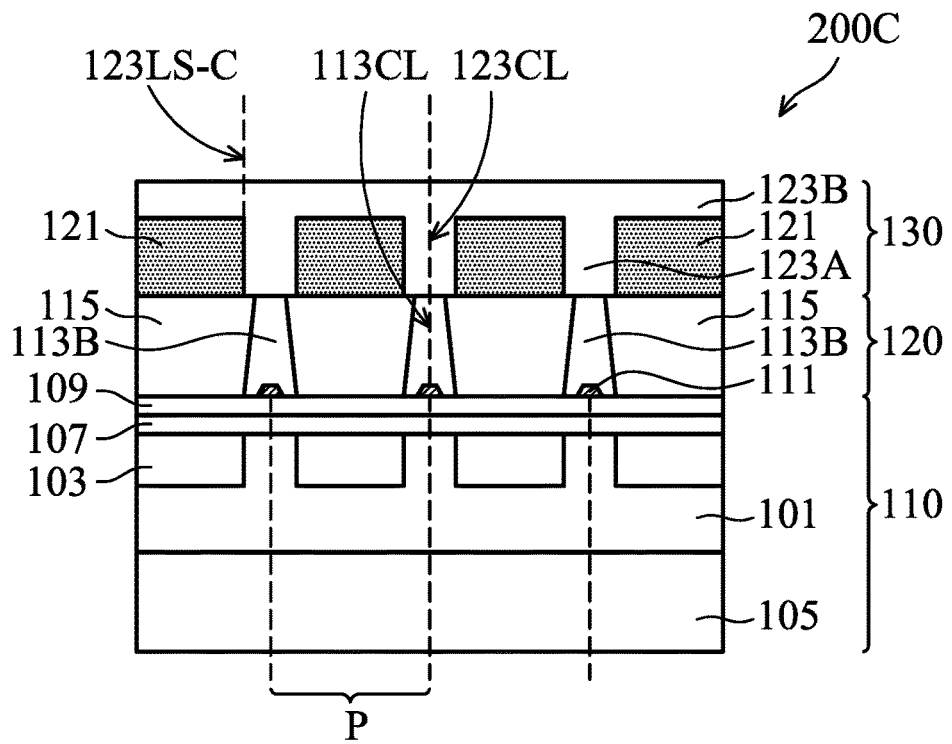
FIG. 6A shows a schematic cross section of a part of a solid-state imaging device with normal pixels at a center area of a pixel array according to some embodiments of the disclosure.

FIG. 6A shows a cross section of a part of a solid-state imaging device 200C with normal pixels at the center area of the pixel array or at the central area of the solid-state imaging device 200C according to some embodiments of the disclosure. Referring to FIG. 6A, the position of the waveguide partition grid 123A is aligned with the position of the color filter partition grid 113B without shifting. The center line 123CL of the respective partition of the waveguide partition grid 123A is aligned with the center line 113CL of the respective partition of the color filter partition grid 113B in a line as shown in FIG. 6A. The left sidewall 123LS-C of the partition of the waveguide partition grid 123A at the center area of the pixel array or at the central area of the solid-state imaging device 200C has no shifting with respect to that of the color filter partition grid 113B.

Figure 6B:
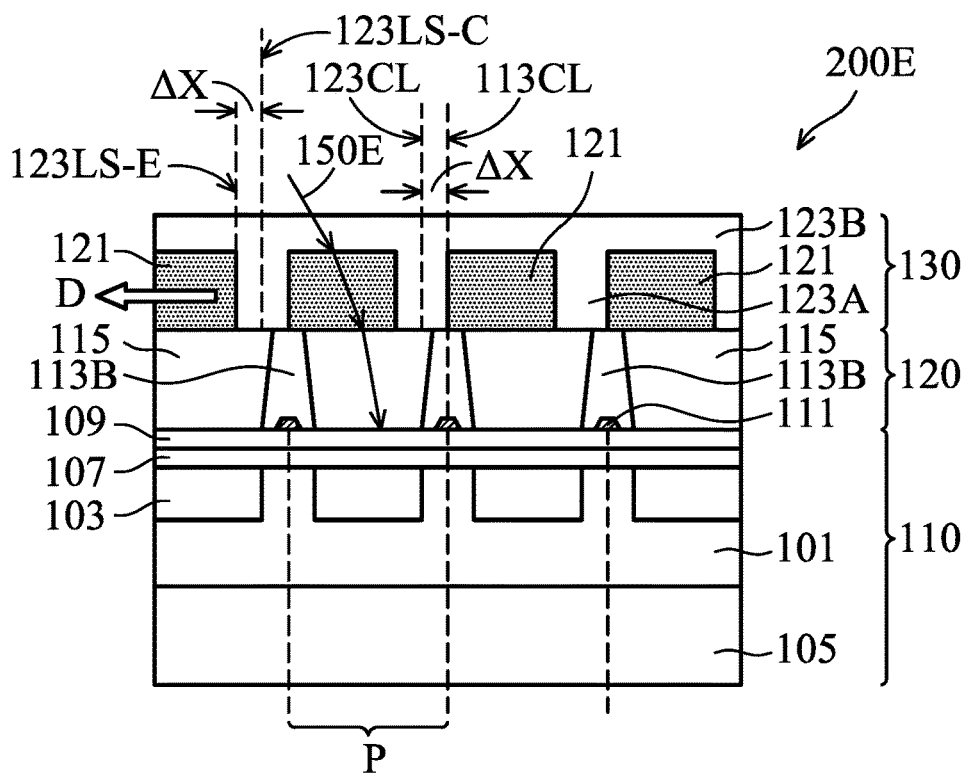
FIG. 6B shows a schematic cross section of a part of a solid-state imaging device with normal pixels at an edge of a pixel array according to some embodiments of the disclosure.

FIG. 6B shows a cross section of a part of a solid-state imaging device 200E with normal pixels at the edge of the pixel array or at the peripheral area outside of the central area of the solid-state imaging device 200E according to some embodiments of the disclosure. Referring to FIG. 6B, the position of the waveguide partition grid 123A at the edge of the pixel array or at the peripheral area of the solid-state imaging device 200E is shifted with respect to the position of the color filter partition grid 113B by a shifting distance ΔX in a direction D. The direction D is a horizontal direction that is on a plane parallel to the top surface of the optical waveguide layer 130. For example, the direction D may be in an X-axial direction, a Y-axial direction or an oblique direction with respect to the X-axial direction and the Y-axial direction. The center line 123CL of the respective partition of the waveguide partition grid 123A is not aligned with the center line 113CL of the respective partition of the color filter partition grid 113B as shown in FIG. 6B. There is the shifting distance ΔX between the center line 123CL and the center line 113CL. The shifting distance ΔX can be adjusted based on sensitivity, channel separation or another performance at the edge of the pixel array or at the peripheral area of the solid-state imaging device. Moreover, the left sidewall 123LS-E of the partition of the waveguide partition grid 123A at the edge of the pixel array or at the peripheral area of the solid-state imaging device 200E also has the shifting distance ΔX with respect to the position of the left sidewall 123LS-C of the partition of the waveguide partition grid 123A at the center area of the pixel array or at the central area of the solid-state imaging device 200C. The shifting distance ΔX of the waveguide partition grid 123A at each pixel is consistent.

According to embodiments of the disclosure, as shown in FIG. 6B, an oblique incident light 150E radiating into the normal pixels at the edges of the pixel array or at the peripheral area of the solid-state imaging devices with shifting in the position of the waveguide partition grid 123A can be guided into the color filter segment 115 and reach a position near the center area of the photoelectric conversion element 103. Therefore, the sensitivity at the edges of the pixel array or at the peripheral area of the solid-state imaging devices is enhanced.

Figure 7A:
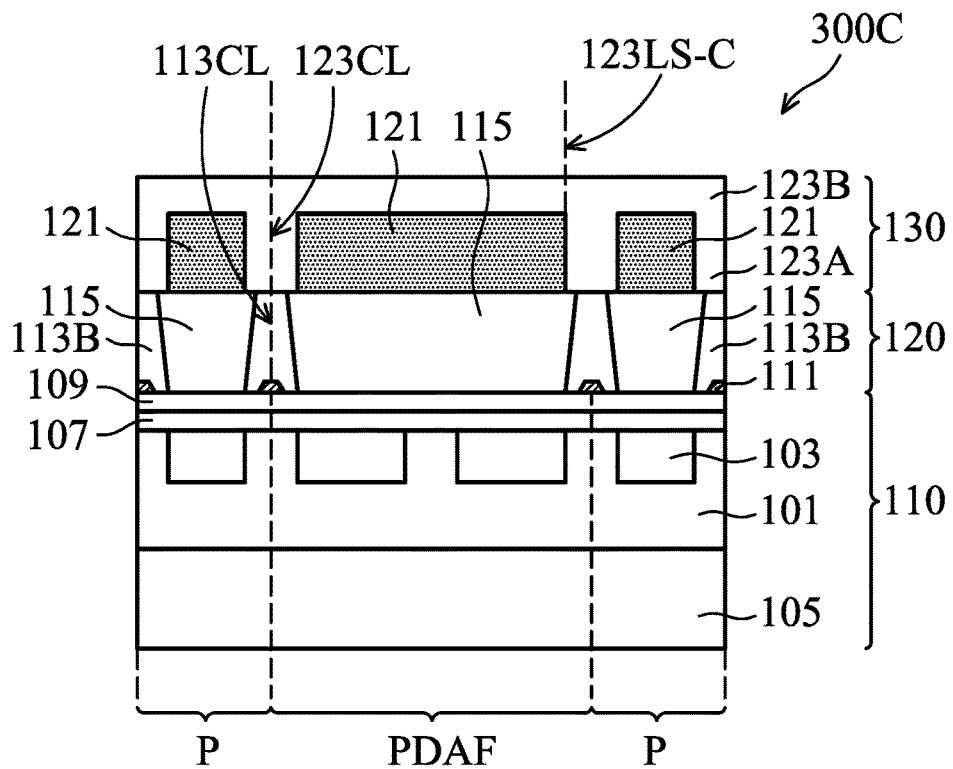
FIG. 7A shows a schematic cross section of a part of a solid-state imaging device with PDAF pixels at a center area of a pixel array according to some embodiments of the disclosure.

FIG. 7A shows a cross section of a part of a solid-state imaging device 300C with PDAF pixels at the center area of the pixel array or at the central area of the solid-state imaging device 300C according to some embodiments of the disclosure. Referring to FIG. 7A, the position of the waveguide partition grid 123A is aligned with the position of the color filter partition grid 113B without shifting. The center line 123CL of the respective partition of the waveguide partition grid 123A is aligned with the center line 113CL of the respective partition of the color filter partition grid 113B in a line as shown in FIG. 7A. In addition, the left sidewall 123LS-C of the partition of the waveguide partition grid 123A at the center area of the pixel array or at the central area of the solid-state imaging device 300C with PDAF pixels has no shifting with respect to that of the color filter partition grid 113B.

Figure 7B:
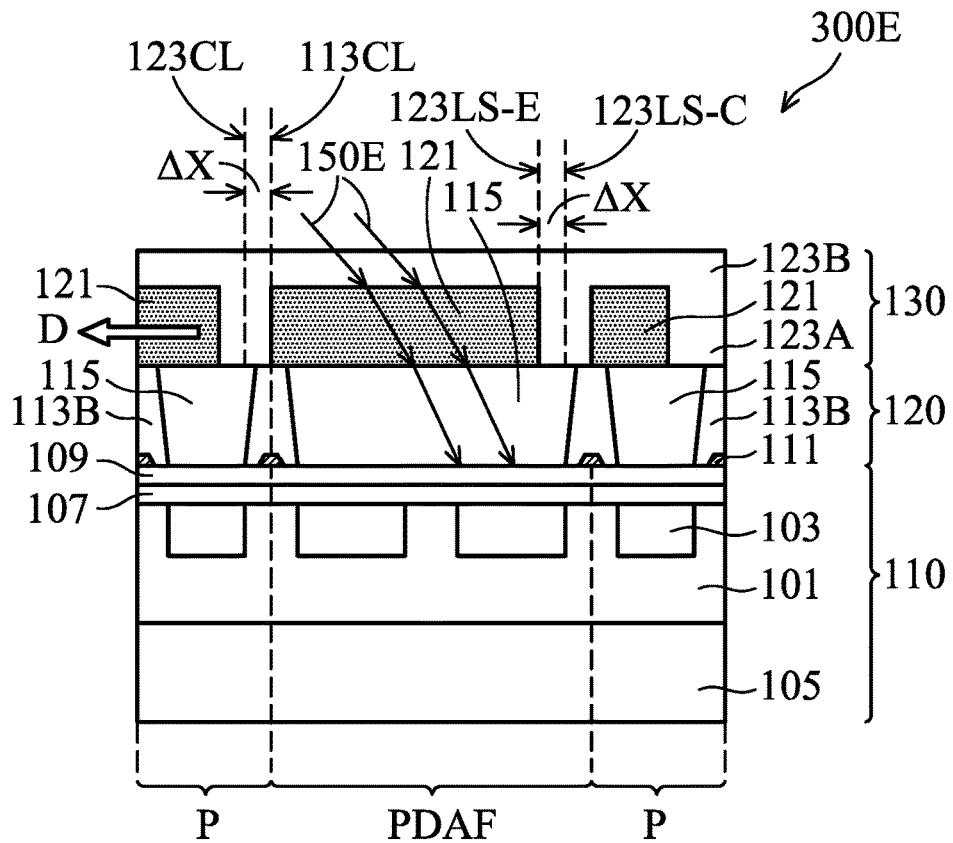
FIG. 7B shows a schematic cross section of a part of a solid-state imaging device with PDAF pixels at an edge of a pixel array according to some embodiments of the disclosure.

FIG. 7B shows a cross section of a part of a solid-state imaging device 300E with PDAF pixels at the edge of the pixel array or at the peripheral area outside of the central area of the solid-state imaging device 300E according to some embodiments of the disclosure. Referring to FIG. 7B, the position of the waveguide partition grid 123A at the edge of the pixel array or at the peripheral area of the solid-state imaging device 300E with PDAF pixels is shifted with respect to the position of the color filter partition grid 113B by a shifting distance ΔX in a direction D. The direction D is a horizontal direction that is on a plane parallel to the top surface of the optical waveguide layer 130. For example, the direction D may be in an X-axial direction, a Y-axial direction or an oblique direction with respect to the X-axial direction and the Y-axial direction. The center line 123CL of the respective partition of the waveguide partition grid 123A is not aligned with the center line 113CL of the respective partition of the color filter partition grid 113B as shown in FIG. 7B. There is the shifting distance ΔX between the center line 123CL and the center line 113CL. The shifting distance ΔX can be adjusted based on sensitivity, channel separation or another performance at the edge of the pixel array or at the peripheral area of the solid-state imaging device. Moreover, the left sidewall 123LS-E of the partition of the waveguide partition grid 123A at the edge of the pixel array or at the peripheral area of the solid-state imaging device 300E with PDAF pixels also has the shifting distance ΔX with respect to the position of the left sidewall 123LS-C of the partition of the waveguide partition grid 123A at the center area of the pixel array or at the central area of the solid-state imaging device 300C.

According to embodiments of the disclosure, as shown in FIG. 7B, oblique incident lights 150E radiating into the PDAF pixels at the edges of the pixel array or at the peripheral area of the solid-state imaging devices with shifting in the position of the waveguide partition grid 123A can be guided into the color filter segment 115 and reach the photoelectric conversion elements 103 at the PDAF pixels to increase phase difference at two different positions in the PDAF pixels. Therefore, the PDAF function at the edges of the pixel array or at the peripheral area of the solid-state imaging devices is enhanced.

Although the structures of FIGS. 6A, 6B, 7A and 7B are illustrated separately, these structures as shown in FIGS. 6A, 6B, 7A and 7B for normal pixels and PDAF pixels and at the center area and the edge of the pixel array or at the central area and the peripheral area of the solid-state imaging device can be combined together in one solid-state imaging device.

Figure 8:
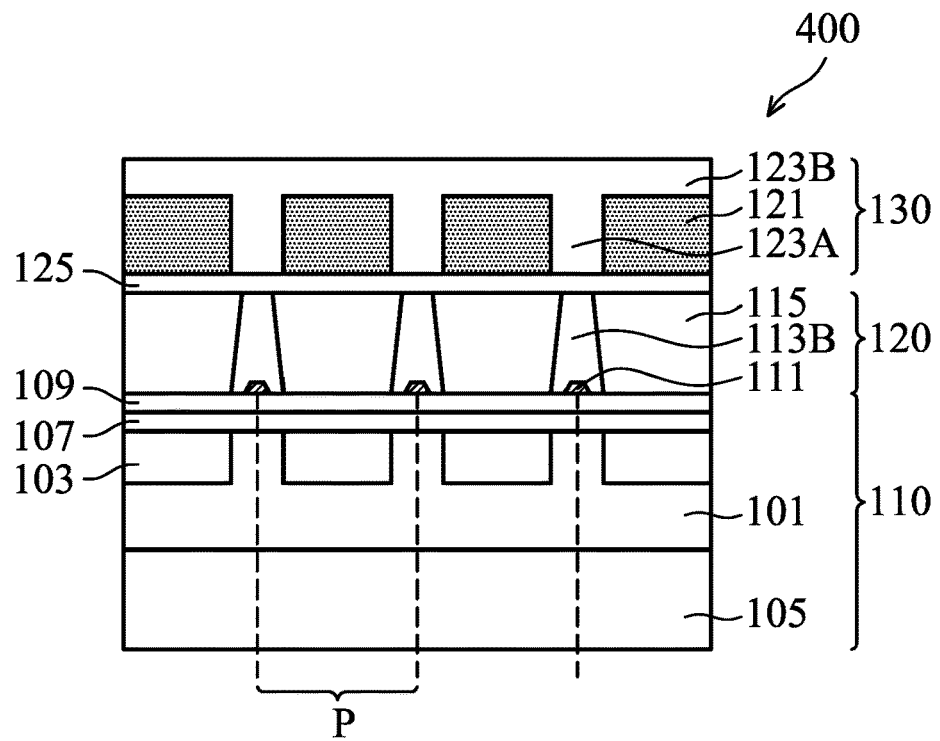
FIG. 8 shows a schematic cross section of a solid-state imaging device with a top-guide structure according to some embodiments of the disclosure.

FIGS. 8 to 11 show cross sections of several solid-state imaging devices with various top-guide structures according to some embodiments of the disclosure. Referring to FIG. 8, in some embodiments, a solid-state imaging device 400 includes a flat layer 125 between the optical waveguide layer 130 and the color filter layer 120. The flat layer 125 is made of a transparent dielectric or insulating material with a refractive index that is lower than the refractive index of the waveguide material 121 of the optical waveguide layer 130 or equal to the refractive index of the waveguide partition grid 123A. The flat layer 125 is formed on the color filter layer 120 using a coating or depositing process before forming the optical waveguide layer 130. While the waveguide material 121 is etched to form the openings for filling the waveguide partition grid 123A, the flat layer 125 can be used as an etch stop layer during the etching process to protect the underlying color filter layer 120. The flat layer 125 may be made of the same material as that of the anti-reflection film 123B of the optical waveguide layer 130. In some examples, the thickness of the flat layer 125 is from about 10 nm to about 100 nm. The various elements of the optical waveguide layer 130, the color filter layer 120 and the photoelectric conversion structure 110 in the solid-state imaging device 400 may be the same as or similar to those described above with respect to the solid-state imaging device 200 of FIG. 3.

Figure 9:
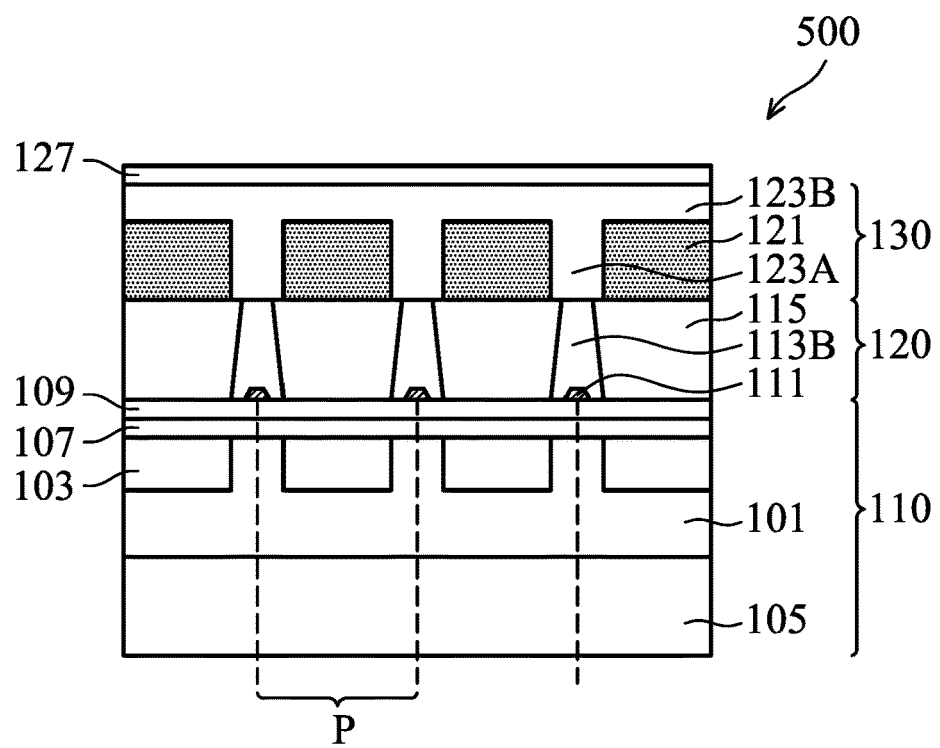
FIG. 9 shows a schematic cross section of a solid-state imaging device with a top-guide structure according to some embodiments of the disclosure.

Referring to FIG. 9, in some embodiments, a solid-state imaging device 500 includes a protective layer 127 on the optical waveguide layer 130. The protective layer 127 can prevent moisture from penetrating into the solid-state imaging device. The protective layer 127 may be made of an inorganic transparent insulating material with a refractive index that is lower than the refractive index of the waveguide material 121 of the optical waveguide layer 130. Moreover, the refractive index of the protective layer 127 is lower than or equal to the refractive index of the waveguide partition grid 123A. The protective layer 127 is formed on the anti-reflection film 123B of the optical waveguide layer 130 using a deposition process such as CVD, PVD or ALD process or a coating process. The protective layer 127 is made of the material that is different from the material of the anti-reflection film 123B. In some examples, the thickness of the protective layer 127 is from about 10 nm to about 100 nm. The various elements of the optical waveguide layer 130, the color filter layer 120 and the photoelectric conversion structure 110 in the solid-state imaging device 500 may be the same as or similar to those described above with respect to the solid-state imaging device 200 of FIG. 3.

Figure 10:
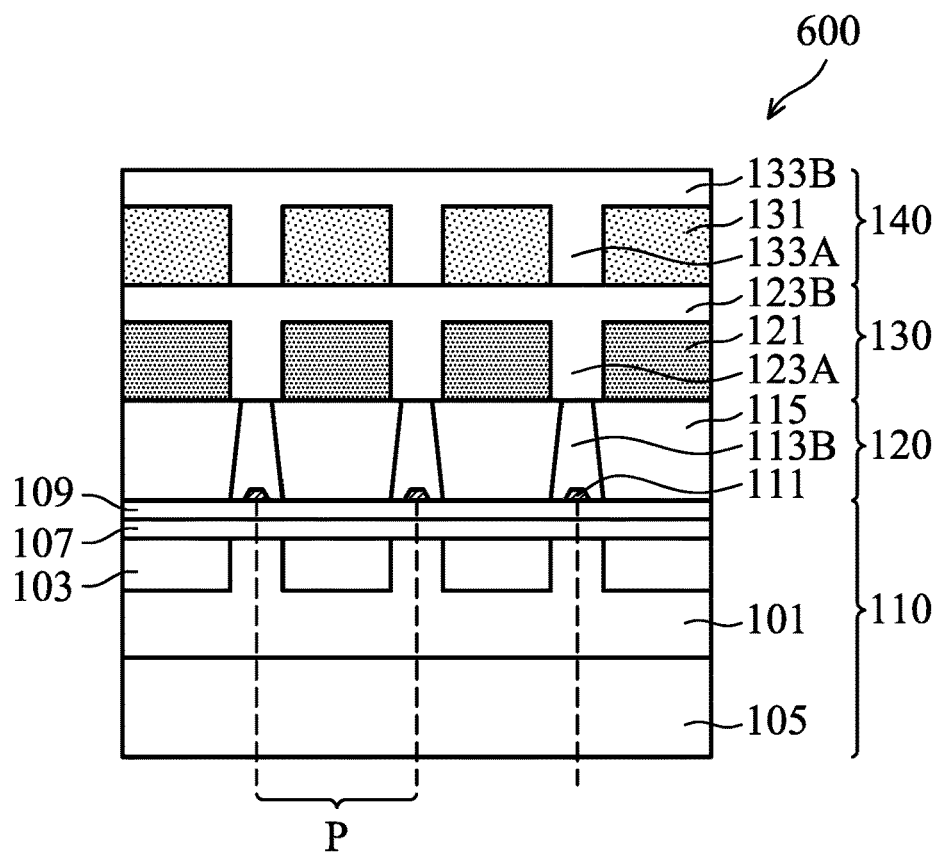
FIG. 10 shows a schematic cross section of a solid-state imaging device with a top-guide structure according to some embodiments of the disclosure.

Referring to FIG. 10, in some embodiments, a solid-state imaging device 600 includes an additional optical waveguide layer 140 on the optical waveguide layer 130. The optical waveguide layer 140 includes a waveguide material 131, a waveguide partition grid 133A and an anti-reflection film 133B. The material and process for forming the optical waveguide layer 140 may be the same as or similar to those described above with respect to the optical waveguide layer 130. Moreover, while the material layer of the waveguide material 131 is etched to form openings for filling the waveguide partition grid 133A, the anti-reflection film 123B of the optical waveguide layer 130 can be used as an etch stop layer in the etching process to protect the underlying structure.

In some embodiments, the refractive index of the waveguide material 121 of the lower optical waveguide layer 130 is higher than the waveguide material 131 of the upper optical waveguide layer 140. Although the solid-state imaging device 600 of FIG. 10 shows one additional optical waveguide layer 140, there may be one or more additional optical waveguide layers stacked on the lower optical waveguide layer 130. In addition, the refractive indexes of the waveguide materials of the optical waveguide layers may be consistent or gradually increase in the direction towards the color filter layer 120. The waveguide partition grid 133A of the optical waveguide layer 140 is aligned with the waveguide partition grid 123A of the optical waveguide layer 130 in the direction that is perpendicular to the top surface of the optical waveguide layer 130. In some embodiments, the upper waveguide partition grid 133A, the lower waveguide partition grid 123A and the color filter partition grid 113B are made of the same material. The various elements of the optical waveguide layer 130, the color filter layer 120 and the photoelectric conversion structure 110 in the solid-state imaging device 600 may be the same as or similar to those described above with respect to the solid-state imaging device 200 of FIG. 3.

Figure 11:
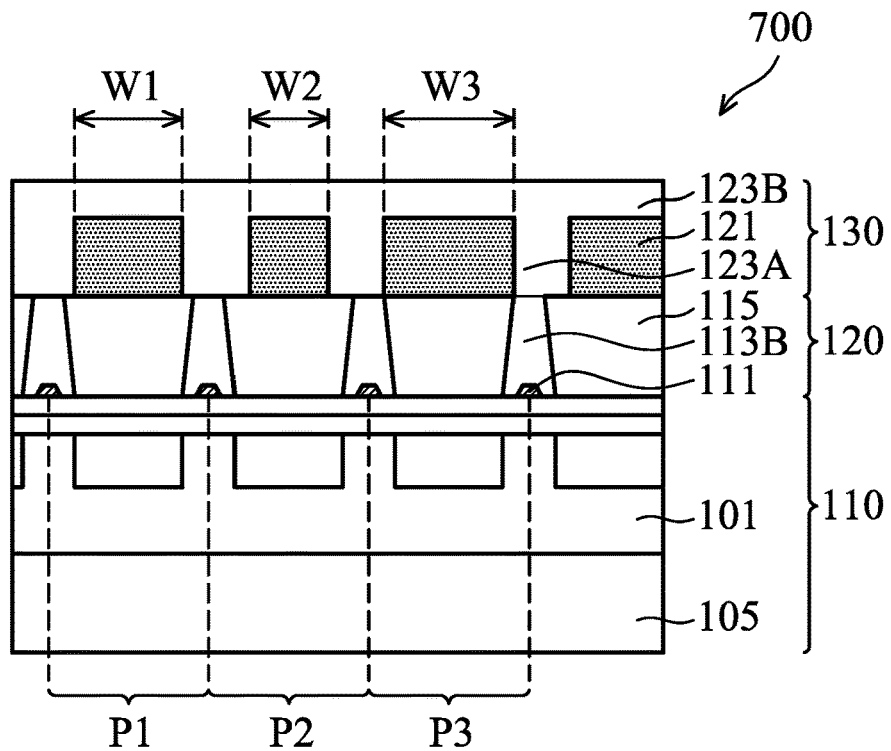
FIG. 11 shows a schematic cross section of a solid-state imaging device with a top-guide structure according to some embodiments of the disclosure.

Referring to FIG. 11, in some embodiments, a solid-state imaging device 700 includes an optical waveguide layer 130 with a waveguide material 121 that has different sizes at the neighboring pixels. In some embodiments, as shown in FIG. 11, the portions of the waveguide material 121 at the first pixel P1, the second pixel P2 and the third pixel P3 have different widths W1, W2 and W3, respectively. In some examples, the waveguide material 121 has different sizes in area at the neighboring pixels. The change in the size of the waveguide material 121 at different pixels may be periodic or aperiodic. The different sizes of the waveguide material 121 at different pixels can be obtained by adjusting the widths of the partitions of the waveguide partition grid 133A at different pixels. In addition, the different sizes of the waveguide material 121 at different pixels can be combined with the shifting of the waveguide partition grid 123A in one solid-state imaging device. The various elements of the color filter layer 120 and the photoelectric conversion structure 110 in the solid-state imaging device 700 may be the same as or similar to those described above with respect to the solid-state imaging device 200 of FIG. 3.

According to the embodiments of the disclosure, an optical waveguide layer is provided above a color filter layer of solid-state imaging devices. The optical waveguide layer includes a waveguide partition grid and a waveguide material in the spaces of the waveguide partition grid. The refractive index of the waveguide material is higher than the low refractive index of the waveguide partition grid. As a result, a total internal reflection occurs at the walls of the waveguide partition grid, and the waveguide material can confine incident lights to propagate towards the color filter segments. Therefore, the optical waveguide layer of the embodiments of the disclosure can avoid cross talk at the corners of the solid-state imaging devices and enhance phase-detection auto-focus (PDAF) function.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
    a plurality of photoelectric conversion elements arrayed in a pixel array;
    a color filter layer including a plurality of color filter segments above the photoelectric conversion elements, wherein each of the color filter segments is disposed in a respective pixel of the pixel array; and
    an optical waveguide layer over the color filter layer, wherein the optical waveguide layer comprises a waveguide partition grid and a waveguide material in spaces of the waveguide partition grid, the waveguide material has a refractive index that is higher than the refractive index of the waveguide partition grid, and the waveguide material provides the same refractive index for each pixel of the pixel array.

2. The solid-state imaging device as claimed in claim 1, further comprising a color filter partition grid under the waveguide partition grid, wherein the color filter segments are disposed in spaces of the color filter partition grid, and the color filter partition grid has a refractive index that is lower than the refractive indexes of the color filter segments.

3. The solid-state imaging device as claimed in claim 2, wherein the pixel array comprises a plurality of first pixels at a center area of the pixel array or at a central area of the solid-state imaging device, and the waveguide partition grid in the first pixels is aligned with the color filter partition grid in a direction that is perpendicular to a top surface of the optical waveguide layer.

4. The solid-state imaging device as claimed in claim 3, wherein the first pixels comprise phase detection auto focus (PDAF) pixels that include a plurality of photoelectric conversion elements disposed under the color filter segments with the same color and in contact with each other.

5. The solid-state imaging device as claimed in claim 2, wherein the pixel array comprises a plurality of second pixels at edges of the pixel array or at a peripheral area outside of a central area of the solid-state imaging device, the waveguide partition grid in the second pixels has a shifting distance with respect to the color filter partition grid in a horizontal direction that is on a plane parallel to a top surface of the optical waveguide layer.

6. The solid-state imaging device as claimed in claim 5, wherein the shifting distances of the waveguide partition grid in the second pixels are consistent.

7. The solid-state imaging device as claimed in claim 5, wherein the shifting distances of the waveguide partition grid in the second pixels are different from each other.

8. The solid-state imaging device as claimed in claim 5, wherein the second pixels comprise phase detection auto focus (PDAF) pixels that include a plurality of photoelectric conversion elements disposed under the color filter segments with the same color and in contact with each other.

9. The solid-state imaging device as claimed in claim 1, further comprising a flat layer between the color filter layer and the optical waveguide layer, wherein the flat layer has a refractive index that is lower than the refractive indexes of the waveguide material or equal to the refractive index of the waveguide partition grid.

10. The solid-state imaging device as claimed in claim 1, further comprising a protective layer over the optical waveguide layer, wherein the protective layer has a refractive index that is lower than or equal to the refractive index of the waveguide partition grid.

11. The solid-state imaging device as claimed in claim 1, further comprising an additional optical waveguide layer disposed above the optical waveguide layer, wherein the additional optical waveguide layer comprises an upper waveguide partition grid and an upper waveguide material in spaces of the upper waveguide partition grid, the upper waveguide material has a refractive index that is higher than the refractive index of the upper waveguide partition grid, the upper waveguide material provides the same refractive index at each pixel of the pixel array, and the refractive index of the waveguide material is higher than that of the upper waveguide material.

12. The solid-state imaging device as claimed in claim 11, wherein the upper waveguide partition grid is aligned with the waveguide partition grid in a direction that is perpendicular to a top surface of the optical waveguide layer.

13. The solid-state imaging device as claimed in claim 11, wherein the upper waveguide partition grid, the waveguide partition grid and the color filter partition grid are made of the same material.

14. The solid-state imaging device as claimed in claim 1, further comprising an anti-reflection film on the waveguide material and the waveguide partition grid, wherein the anti-reflection film and the waveguide partition grid are made of the same material.

15. The solid-state imaging device as claimed in claim 1, wherein the waveguide material in each pixel has a width, each pixel has a pixel width, and a ratio of the width to the pixel width is from about 0.15 to about 0.95.

16. The solid-state imaging device as claimed in claim 1, wherein the waveguide material at different pixels has different widths, and a change in the widths of the waveguide material at different pixels is periodic.

17. The solid-state imaging device as claimed in claim 1, wherein the waveguide material at different pixels has different widths, and a change in the widths of the waveguide material at different pixels is aperiodic.

18. The solid-state imaging device as claimed in claim 1, wherein the waveguide material has the same width in each pixel of the pixel array.

19. The solid-state imaging device as claimed in claim 1, wherein the waveguide material has a thickness that is from about 0.2 µm to about 1.5 µm.

20. The solid-state imaging device as claimed in claim 1, wherein the refractive index of the waveguide partition grid is in a range from 1.0 to 1.99, and the refractive index of the waveguide material is in a range from 1.1 to 2.0.

* * * * *